United States Patent [19]

Shiraishi et al.

[11] Patent Number: 4,888,299
[45] Date of Patent: Dec. 19, 1989

[54] ROUTING AMONG FIELD EFFECT TRANSISTORS

[75] Inventors: Yoichi Shiraishi, Higashimatsuyama; Junya Sakemi, Tokyo; Kunio Ono, Ome; Ichiro Naka, Akishima, all of Japan

[73] Assignees: Hitachi, Ltd.; Hitachi VLSI Engineering Corporation, both of Tokyo, Japan

[21] Appl. No.: 313,627

[22] Filed: Feb. 21, 1989

[30] Foreign Application Priority Data

Feb. 26, 1988 [JP] Japan .................................. 63-42060

[51] Int. Cl.⁴ ........................................... H01L 21/70
[52] U.S. Cl. .................................... 437/51; 437/189; 437/195
[58] Field of Search ......................... 437/51, 189, 195; 364/488, 489, 490, 491

[56] References Cited

U.S. PATENT DOCUMENTS

| 4,516,312 | 5/1985 | Tomita | 437/51 |
| 4,577,276 | 3/1986 | Dunlop et al. | 364/488 |
| 4,615,011 | 9/1986 | Linsker | 364/491 |
| 4,636,965 | 1/1987 | Smith et al. | 364/491 |
| 4,691,434 | 9/1987 | Perciual et al. | 437/51 |
| 4,745,084 | 5/1988 | Rowsow et al. | 437/51 |

OTHER PUBLICATIONS

Y. Shiraishi, et al., "A Permeation Router", IEEE Trans. CAD for ICAS CAD-6, No. 3, 1987, pp. 462-471.

Primary Examiner—Brian E. Hearn
Assistant Examiner—T. Thomas
Attorney, Agent, or Firm—Fay, Sharpe, Beall, Fagan, Minnich & McKee

[57] ABSTRACT

Interconnections interconnecting terminals to be connected by routings are dissolved into two-terminal interconnections and it is determined to which kind of terminals the terminals of each two-terminal interconnection belong, among connected diffusion layer, separated diffusion layer and gate. The interconnections are classified into groups by the combination of the kind of two terminals for each interconnection. The respective groups of interconnections are routed in the channel on the field effect transistor row according to a predetermined order of groups.

5 Claims, 5 Drawing Sheets

FIG. 5

| CASE<br>ORDER | A | B | C | D |
|---|---|---|---|---|
| 1 | a-a | a-b | a-a | a-b |
| 2 | a-b | a-a | a-b | a-a |
| 3 | b-b | b-b | b-b | b-b |
| 4 | a-c | a-c | b-c | b-c |
| 5 | b-c | b-c | a-c | a-c |
| 6 | c-c | c-c | c-c | c-c | a : CONNECTED DIFFUSION LAYER
b : SEPARATED DIFFUSION LAYER
c : GATE

ROUTING AMONG FIELD EFFECT TRANSISTORS

BACKGROUND OF THE INVENTION

This invention relates to routing among terminals of field effect transistors.

Conventionally, IEEE Trans CAD for ICAS, CAD-6, No. 3 (1987) pp. 462–471 discusses the selection criteria in the routing among field effect transistors what interconnections are selected and routed in the channel on field effect transistor rows.

According to this conventional technique, in determining the priority of routing in the channel on the field effect transistor rows, those interconnections which have longer wiring length among the interconnections which passes through a region where interconnections congested regardless of their kinds are selected for effectively utilizing the channel on the transistor row.

SUMMARY OF THE INVENTION

An object of this invention is to provide a method of routing among field effect transistors, employing criteria according to the kinds of terminals, as the selection criteria for the routing in the channel on the transistor rows.

For achieving the alone object, each interconnection is dissolved into two-terminal interconnections. Here, letting the diffusion layers and gates be denoted as terminals, each interconnection connecting two terminals is called two-terminal interconnection. The kinds of terminals at the both ends of the two-terminal interconnections are checked. Then, the interconnections are classified into the following groups and the interconnections in these groups are routed in the channel on the transistor row according to the predetermined order.

Interconnection groups:
(a) a two-terminal interconnection connecting a connected diffusion layer and another connected diffusion layer;
(b) a two-terminal interconnection connecting a separated diffusion layer and a connected diffusion layer;
(c) a two-terminal interconnection connecting a separated diffusion layer and another separated diffusion layer;
(d) a two-terminal interconnection connecting a connected diffusion layer and a gate;
(e) a two-terminal interconnection connecting a separated diffusion layer and a gate; and
(f) a two-terminal interconnection connecting a gate and another gate.

The criteria of priority of routing selection in a same interconnection group is to give priority to a longer wiring length in the interconnections which pass through a region where interconnections congested, similar to the conventional case.

By dissolving the interconnections into two-terminal interconnections, the interconnections can be handled at the minimum unit. Thereby, for the interconnections among field effect transistors, the channel on the field effect transistor row can be effectively used. The channel on the transistor row has a finite transverse length. Thus, the transverse length of the channel outside the transistor row can be reduced. The two-terminal interconnections are routed in the channel on the field effect transistor row according to the priority which is based on the kind of terminals at the both ends of each interconnection. When those two-terminal interconnections which will require a feedthrough when connected outside the channel on the field effect transistor row are preferentially selected and routed in the channel on the field effect transistor row, the number of feedthroughs required will decrease, enabling to decrease the longitudinal length of the channel.

As can be seen from the above, the area of a cell can be reduced by reducing the channel area required for interconnections among field effect transistors. Thus, the chip area can be reduced and hence the manufacturing cost thereof can be reduced.

BRIEF DESCRIPTION OF THE DRAWING

FIG. 5 shows selection criteria for the two-terminal interconnections.

DESCRIPTION OF THE PREFERRED EMBODIMENT

Figure 3:
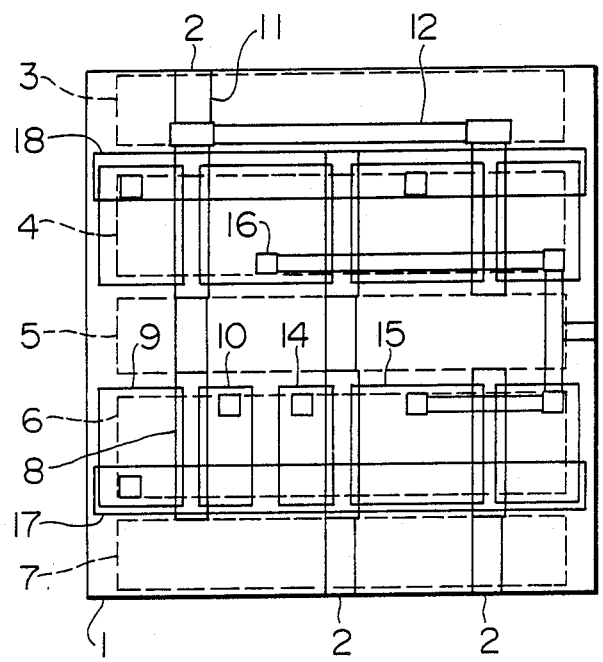
FIG. 3 schematically shows a layout for illustrating the framework of the routing in a cell.

FIG. 3 shows a layout model of a cell which the present embodiment is to use. Now, the framework of the routing among field effect transistors will be described referring to FIG. 3.

Region 1 represents an outer extent of a cell. Terminal 2 is an external terminal for connecting a signal line from outside of the cell. Here, the word "cell" represents a functional unit which forms a unit in the chip layout. In the cell shown in FIG. 3, field effect transistors are disposed in two rows. Gates 8, sources 9, and drains 10 of these field effect transistors and the external terminals will be interconnected. The sources 9 and the drains 10 are formed of diffusion layers. One gate 8, one source 9 and one drain 10 will constitute one field effect transistor. When adjacent diffusion layers of adjacent field effect transistors are at different potential, they are kept to be separated as diffusion layers 10 and 14. These diffusion layers are called separated diffusion layers. When adjacent diffusion layers are at the same potential, they are merged as a diffusion layer 15. Here, the area of a cell is reduced by disposing field effect transistors co-using a diffusion layer as shown at 15. This is called a connected diffusion layer. Regarding the routing among field effect transistors, after the positions or locations of the respective field effect transistors are determined, the gates 8, the diffusion terminals 16 and the external terminals 2 are interconnected using two layers of a first aluminum (Al) layer 12 and a polycrystalline silicon (poly-Si) layer 11. Here, routings 17 and 18 are a ground line and a power line, which are fixed lines the locations of which are preliminarily determined. These are following fine channels where interconnections are routed. In FIG. 3, these channels are shown by dotted lines. Namely, there are two channels 4 and 6 on the respective two transistor rows, a channel 5 sandwitched between the two transistor rows, and outer channels 3 and 7 shown above and below the transistor rows. The transverse lengths, i.e. vertical widths in the figure, of the channels 4, 5 and 6 are respectively fixed. The longitudinal lengths of the channels 3 and 7 are variable and are fixed at the end of routing. In the areas of the channels 4 and 6 on the transistor rows, only the first Al layer is available. When there exists a poly-Si layer on a diffusion layer, a new transistor may be formed. Therefore, feedthroughs utilizing poly-Si layers and connecting between the channels 5 and 3 or the channels 5 and 7 across the transistor row should traverse the transistor row at those locations 10 and 14 where the diffusion layers are preliminarily separated, or at the locations where the diffusion layers are newly separated. In the latter case, the longitudinal length of the cell shown in the horizontal direction in the figure should increase, increasing the cell area.

When at least one of the channel 5 between the transistor rows, and the channels 3 and 7 outside the transistor rows is used not to form any feedthrough, the transverse length of the cell should increase, also resulting in an increase in the cell area similar to the case of forming feedthroughs.

An embodiment of this invention will be described referring to FIGS. 1A, 1B, 1C and 2.

Figure 2:
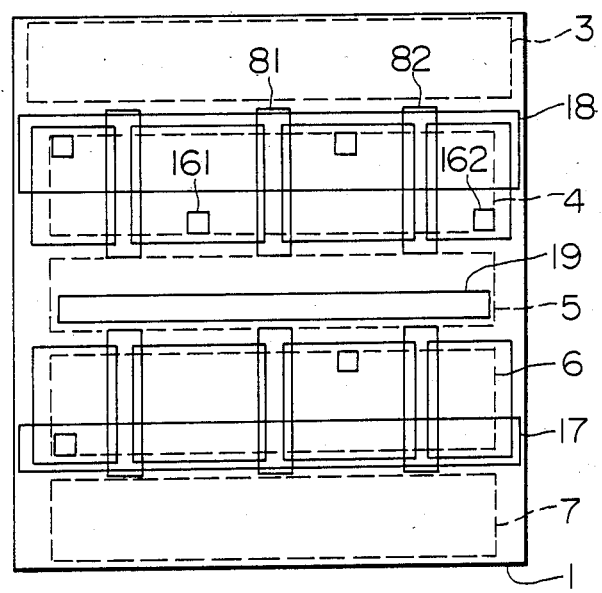
FIG. 2 shows a layout of a cell before the formation of interconnections, which is a subject of the embodiment.

FIG. 2 shows an example of a cell before the formation of interconnections. A region 1 represents the outer extent of the cell. In the cell shown in FIG. 2, the regions where interconnections can be routed are a channel 3 shown above the transistor rows, channels 4 and 6 on the transistor rows, a channel 5 between the transistor rows and a channel 7 shown below the transistor rows. These regions are denoted by dotted lines in FIG. 2. Here, however, such routings as a routing 18 occupying part of the channel 4, a routing 17 occupying part of the channel 6, and a routing 19 occupying part of the channel 5 are routings the use of which are preliminarily determined such as ground lines, power lines, etc. They are not available for the interconnections among field effect transistors.

Routing of a first net connecting the terminals 161 and 162 of diffusion layers and of a second net connecting the gate terminals 81 and 82 will be done. Here, the word "net" represents an assembly of terminals which should be kept at the same potential. It will be determined which net will be routed in the channel 4 on the transistor row.

Hereinbelow, description will be made on an embodiment in which routing is done in the cell as shown in FIG. 2 according to the order to be determined by 15 the present routing algorithm. In the embodiment of this invention, as many interconnections as possible will be routed on the channels 4 and 6 on the transistor rows, thereby reducing the transverse length of the cell. At the same time, the number of feedthroughs will be reduced as much as possible to thereby reduce the longitudinal length of the cell.

Figure 4:
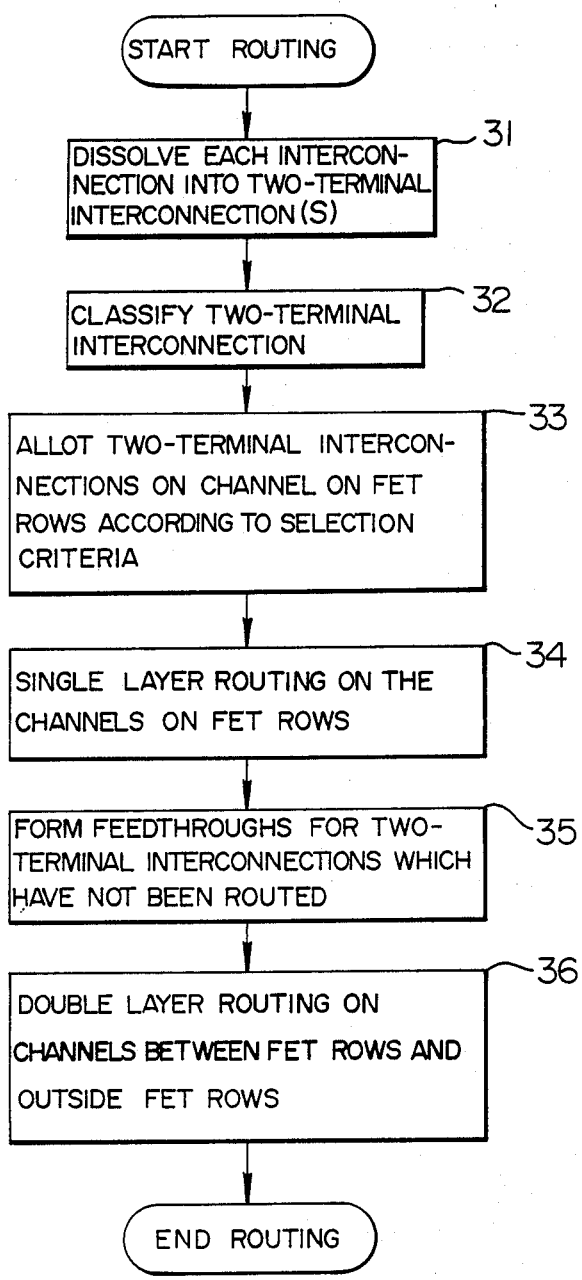
FIG. 4 is a flow chart of the entire routing process including the routing of this invention.

FIG. 4 shows a flow chart of the whole routing process including the inventive routing. First, each interconnection is dissolved into two-terminal interconnection(s) (step 31). The kind of the two terminals of each two-terminal interconnection is checked, whether they are connected diffusion layer, separated diffusion layer or gate, and is classified according to the kind of the terminals (step 32). According to the obtained results and the selection criteria of routing to be described later, as many two-terminal interconnections as possible will be allotted to the channels on the field effect transistor rows, while preventing shortcircuiting between first aluminum layers (step 33).

These three steps 31, 32 and 33 feature the present invention.

FIG. 5 shows the selection criteria mentioned before. The selection criteria are based on the kinds of the two terminals at the both ends of each two-terminal interconnection. Three kinds by three kinds of terminals make six interconnection groups. Each interconnection will be classified into one of these six groups. FIG. 5 lists these interconnection groups according to the order of priority in routing. In this embodiment, four kinds of criteria A, B, C and D are set as shown in FIG. 5 as the criteria for routing for reducing the number of feedthroughs as much as possible. For example, the notation "a-b" in the second order of case A denotes an interconnection group connecting a connected diffusion layer and a separated diffusion layer. In case when a plurality of interconnections belong to the same interconnection group, an interconnection having a longer wiring length has priority. Either of four kinds of criteria is effective for reducing the number of feedthroughs.

Next, based on the results of allocation, routing of single layer wiring in the channels on the field effect transistor rows will be determined (step 34). In the present process, it is already assured that each two-terminal interconnection is prevented from shortcircuiting by the step 33. Considering that the transverse length of the channels 4 and 6 on the transistor rows is fixed and the area available for regions 17 and 18 is limited, the interconnections will be routed. Those two-terminal interconnections which cannot be accommodated on the channels on the field effect transistor rows are routed by forming feedthroughs (step 35). Finally, routing on the channel 5 sandwiched between the field effect transistor rows and routing on the outer channels 3 and 7 outside the field effect transistor rows will be achieved independently (step 36).

Figure 1A:
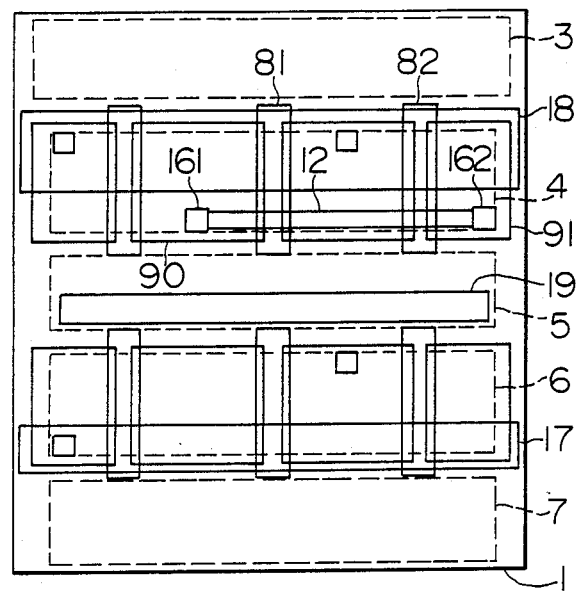
FIGS. 1A, 1B and 1C illustrate a embodiment of routing according to this invention.
Figure 1B:
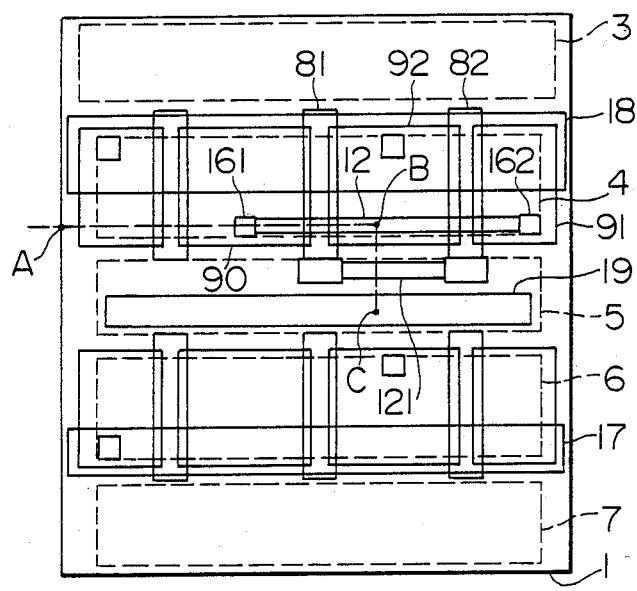
Figure 1C:
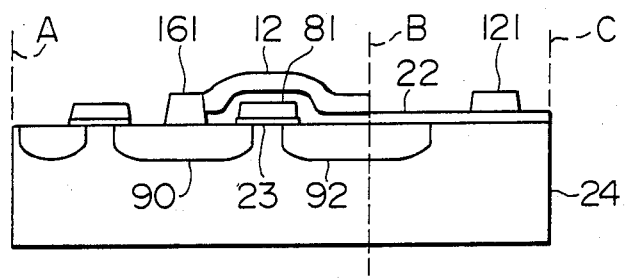

FIGS. 1A, 1B and 1C show the result of routing in the cell shown in FIG. 2 through the steps according to the above-mentioned embodiment.

In FIGS. 1A, 1B and 1C, the first net which interconnects the connected diffusion layers 161 and 162 is achieved by an aluminum routing 12 in the channel 4 (FIG. 1A), and the second net which interconnects the gates 81 and 82 is achieved by an aluminum routing 121 in the channel 5 (FIG. 1B).

FIG. 1C shows a cross-section of the cell after routing along a broken line A-B-C in FIG. 1B. Numeral 22 denotes an insulation layer for forming the aluminum routings 12 and 121 thereon. Numeral 23 denotes an insulation layer for forming the gate 81 thereon. Diffusion layers 90 and 92 are formed in an upper part of the substrate 24.

Steps for forming these interconnections will be described. The kinds of terminals of the first net and the second net are examined according to the above-mentioned classification. Here, the first net is the interconnection connecting a connected diffusion layer 161 and a connected diffusion layer 162, and the second net is an interconnection connecting a gate 81 and a gate 82. By the selection criteria of the case A shown in FIG. 5, first the first net is routed in the channel 4 on the transistor row, and then the second net is routed in the channel 5. Here, there exists already one routing 18 extending longitudinally in the channel 4, such as a power line. There also exists a similar interconnection 17 in the channel 6. In the channel 5, also, there exists a similar interconnection 19.

According to the present routing, the longitudinal length of a cell along the longitudinal direction of the field effect transistor row does not change between before and after the routing as shown in FIG. 1. If routing is done without the selection criteria shown in FIG. 5, a feedthrough will be necessitated for the routing connecting the connected diffusion layers 161 and 162 and the longitudinal length of the cell will increase.

We claim:

1. A method of routing terminals of field effect transistors in a cell having at least two field effect transistor rows each having a fixed transverse length, channels on said field effect transistor rows where single wiring layer can be used, a channel sandwiched between each pair of said field effect transistor rows, and having a fixed transverse length where double wiring layers can be used, and channels outside the field effect transistor rows where double wiring layers can be used, by using a feedthrough or feedthroughs traversing across the field effect transistor row for interconnecting the routings in these channels and by interconnecting diffusion layers and gates which are the terminals of the field effect transistors, comprising the steps of:

dissolving given interconnections into two-terminal interconnections;

selecting as many two-terminal interconnections from said dissolved two-terminal interconnections as possible provided that the respective selected two-terminal interconnections do not cause any shortcircuit;

providing selection criteria of interconnection in routing on a wirable region of a channel on the field effect transistor row, selecting two-terminal interconnections to be routed in the channel on the field effect transistor row according to the criteria and routing the selected two-terminal interconnections;

making a feedthrough for a non-selected two-terminal interconnection and routing the non-selected interconnection; and finally routing two-terminal interconnections in the channels where double wiring layers can be used.

2. A method of routing terminals of field effect transistors according to claim 1, wherein said criteria includes classifying the two-terminal interconnections into (a) two terminal interconnection interconnecting a pair of connected diffusion layers each of which is merged with an adjacent diffusion layer of an adjacent field effect transistor which is to be held at the same potential;

(b) two-terminal interconnection interconnecting a connected diffusion layer and a separated diffusion layer which cannot be merged with an adjacent diffusion layer of an adjacent field effect transistor because of a different potential to be applied thereto;

(c) two-terminal interconnection interconnecting a separated diffusion layer and another separated diffusion layer;

(d) two-terminal interconnection interconnecting a connected diffusion layer and a gate;

(e) two-terminal interconnection interconnecting a separated diffusion layer and a gate; and (f) two-terminal interconnection interconnecting a gate and another gate, and selecting two-terminal interconnections to be routed in the channel on the field effect transistor row according to the above-described order.

3. A method of routing terminals of field effect transistors according to claim 1, wherein said criteria include classifying two-terminal interconnections into (a) two-terminal interconnection interconnecting a separated diffusion layer which is not merged with an adjacent diffusion layer of an adjacent field effect transistor because of a different potential to be applied thereto, and a connected diffusion layer which is merged with an adjacent diffusion layer of an adjacent field effect transistor which is to be held at the same potential;

(b) two-terminal interconnection interconnecting a pair of connected diffusion layers;

(c) two-terminal interconnection interconnecting a pair of separated diffusion layers;

(d) two-terminal interconnection interconnecting a connected diffusion layer and a gate;

(e) two-terminal interconnection interconnecting a separated diffusion layer and a gate;

(f) two-terminal interconnection interconnecting a pair of gates, and selecting two-terminal interconnections to be routed in the channel on the field effect transistor row according to the above-described order.

4. A method of routing terminals of field effect transistors according to claim 1, wherein said criteria include classifying two-terminal interconnections into (a) two-terminal interconnection interconnecting a pair of connected diffusion layers each of which is merged with an adjacent diffusion layer of an adjacent field effect transistor which is to be held at the same potential;

(b) two-terminal interconnection interconnecting a separated diffusion layer which is not merged with an adjacent diffusion layer of an adjacent field effect transistor because of a different potential to be applied thereto, and a connected diffusion layer;

(c) two-terminal interconnection interconnecting a pair of separated diffusion layers;

(d) two-terminal interconnection interconnecting a separated diffusion layer and a gate;

(e) two-terminal interconnection interconnecting a connected diffusion layer and a gate;

(f) two-terminal interconnection interconnecting a pair of gates, and selecting two-terminal interconnections to be routed in the channel on the field effect transistor row according to the above-described order.

5. A method of routing terminals of field effect transistors according to claim 1, wherein said criteria includes classifying two-terminal interconnections into (a) two-terminal interconnection interconnecting a separated diffusion layer which is not merged with an adjacent diffusion layer of an adjacent field effect transistor because of a different potential to be applied thereto, and a connected diffusion layer which is merged with an adjacent diffusion layer of an adjacent field effect transistor which is to be held at the same potential;

(b) two-terminal interconnection interconnecting a pair of connected diffusion layers;

(c) two-terminal interconnection interconnecting a pair of separated diffusion layers;

(d) two-terminal interconnection interconnecting a separated diffusion layer and a gate;

(e) two-terminal interconnection interconnecting a connected diffusion layer and a gate;

(f) two-terminal interconnection interconnecting a pair of gates, and selecting two-terminal interconnections to be routed in the channel on the field effect transistor row according to the above-described order.

* * * * *